United States Patent
Hahn et al.

(10) Patent No.: US 8,050,093 B2
(45) Date of Patent: Nov. 1, 2011

(54) NON-VOLATILE MEMORY DEVICE AND BAD BLOCK REMAPPING METHOD

(75) Inventors: Wook-ghee Hahn, Hwaseong-si (KR);
Jai-ick Son, Hwaseong-si (KR);
Youn-yeol Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 268 days.

(21) Appl. No.: 12/458,999

(22) Filed: Jul. 29, 2009

(65) Prior Publication Data
US 2010/0046292 A1   Feb. 25, 2010

(30) Foreign Application Priority Data

Aug. 25, 2008   (KR) .................. 10-2008-0083027

(51) Int. Cl.
*G11C 11/34*   (2006.01)
(52) U.S. Cl. .......... 365/185.09; 365/185.11; 365/230.03
(58) Field of Classification Search ............. 365/185.09, 365/185.11, 230.03
See application file for complete search history.

(56) References Cited

U.S. PATENT DOCUMENTS

| | | | |
|---|---|---|---|
| 5,841,957 A * | 11/1998 | Ju et al. ................. | 714/6.13 |
| 6,625,071 B2 | 9/2003 | Ikeda et al. | |
| 6,956,769 B2 | 10/2005 | Lee | |
| 7,434,122 B2 | 10/2008 | Jo | |

FOREIGN PATENT DOCUMENTS

| | | |
|---|---|---|
| JP | 2003-045196 A | 2/2003 |
| KR | 10-2003-0072433 A | 9/2003 |
| KR | 10-2006-0012696 A | 2/2006 |

* cited by examiner

*Primary Examiner* — Son Dinh
*Assistant Examiner* — Nam Nguyen
(74) *Attorney, Agent, or Firm* — Lee & Morse, P.C.

(57) ABSTRACT

A non-volatile memory device and a bad block remapping method use some of main blocks as remapping blocks to replace a bad block in a main cell block and selects remapping blocks using existing block address signals. Thus, separate bussing of remapping block address signals is not needed. The bad block remapping includes comparing an external block address input from an external source to a stored bad block address, generating a bad block flag signal when the external block address is identical to the stored bad block address, generating a remapping block address selecting the remapping blocks in response to a remapping address corresponding to the bad block address, selecting one of the external block address and the remapping block address in response to the bad block flag signal to create a selected address, and outputting a row address signal in accordance with the selected address.

14 Claims, 4 Drawing Sheets

FIG. 2

< REDUNDANT BLOCK ADDRESS >

|  | $X_{10}$ | $X_9$ | $X_8$ | $X_7$ | $X_6$ | $X_5$ | $X_4$ | $X_3$ | $X_2$ | $X_1$ | $X_0$ |
|---|---|---|---|---|---|---|---|---|---|---|---|
| MCB 2047 | 1 | 1 | 1 | 1 | 1 | 1 | 1 | 1 | 1 | 1 | 1 |
| MCB 2046 | 1 | 1 | 1 | 1 | 1 | 1 | 1 | 1 | 1 | 1 | 0 |
| MCB 2045 | 1 | 1 | 1 | 1 | 1 | 1 | 1 | 1 | 1 | 0 | 1 |
| ⋮ | | | | | | ⋮ | | | | | |
| MCB 2019 | 1 | 1 | 1 | 1 | 1 | 1 | 0 | 0 | 0 | 1 | 1 |
| MCB 2018 | 1 | 1 | 1 | 1 | 1 | 1 | 0 | 0 | 0 | 1 | 0 |

NON-VOLATILE MEMORY DEVICE AND BAD BLOCK REMAPPING METHOD

BACKGROUND

1. Field

Embodiments relate to a semiconductor memory device, and more particularly, to a non-volatile memory device having a bad block remapping function and a bad block remapping method.

2. Description of the Related Art

Flash memory devices are non-volatile memory devices for electrically recording and erasing data. Memory cells of a flash memory device are configured in a plurality of blocks, and each of the blocks includes a plurality of pages. In particular, a block is an elementary unit for erasing data stored in a memory cell.

Flash memory devices program and erase data by using a tunneling effect, in which a particle penetrates a high energy barrier, and a hot carrier effect, in which a hot carrier having a high kinetic energy penetrates an insulating material. Since flash memory devices program and erase data, data can be programmed in a flash memory cell a limited number of times, and the flash memory cell might fail to write data. In addition, due to a variety of restrictions on manufacturing flash memory devices requiring a high integration density, defective flash memory cells might be manufactured.

During the manufacture or operation of flash memory devices, a fatal problem can occur in a memory cell. A block having at least one defective memory cell is referred to as a bad block. A flash memory device having an at least predetermined number, e.g., at least five, of bad blocks is determined to be a failure article.

A flash memory device having a predetermined number or less of bad blocks uses a method of managing a bad block. An example of the method includes a bad block mapping method in which a bad block is replaced with a redundant block. The bad block mapping method includes checking an address of the bad block, impeding writing and reading data in the bad block, replacing the bad block with the redundant block, and writing and reading data in the redundant data.

SUMMARY

Embodiments are directed to a non-volatile memory device having a bad block remapping function and a bad block remapping method, which substantially overcome one or more of the problems due to the limitations and disadvantages of the related art.

It is a feature of an embodiment to provide a non-volatile memory device that does not require separate bussing of remapping block address signals.

It is another feature of an embodiment to provide a non-volatile memory device that selects remapping blocks using existing block address signals.

It is yet another feature of an embodiment to provide a bad block remapping method of the non-volatile memory device.

At least one of the above and other features and advantages may also be realized by providing a non-volatile memory device including a memory cell array including a plurality of main cell blocks, and using a predetermined number of the main cell blocks as remapping blocks for replacing a bad block in the main cell blocks, a row decoder unit decoding a row address signal to generate block address signals addressing the main cell blocks, and a remapping block mapping controlling unit. The remapping block mapping controlling unit is configured to compare an external block address input by an external source and a bad block address stored in a chip, generate a bad block flag signal, generate a remapping block address for selecting the remapping blocks by matching a remapping address with the bad block address, selecting one of the external block address and the remapping block address in response to the bad block flag signal as a selected address, and outputting the row address signal in accordance with the selected address.

The predetermined number of remapping blocks may include main cell blocks from a main cell block having an uppermost address to a main cell block counted from the main cell block having the upper most address in reverse order up to the predetermined number.

The row decoder unit may include a row pre-decoder configured to decode the row address to generate the block address signals, and a row decoder connected to each of the main cell blocks and configured to select a corresponding main cell block from among the main cell blocks in response to the block address signals.

The remapping block mapping controlling unit may include a bad block address storage circuit configured to store the bad block address and generate the remapping address, a comparing unit configured to compare the external block address to the bad block address and generate the bad block flag signal, a remapping block mapping storage circuit configured to generate the remapping block address corresponding to the remapping address in response to the remapping address, and a main/remapping block address MUX unit configured to select the selected address in response to the bad block flag signal, and output the row address signal in accordance with the selected address.

The bad block address storage circuit may include a register.

The remapping block mapping storage circuit may include a plurality of cell transistors arranged in rows and columns, and the cell transistors may be electrically connected to a power voltage source or a ground voltage source, and the remapping address may be supplied to gates of the cell transistors.

The main/remapping block address MUX unit may include a first AND gate to which the bad block flag signal and the external block address are input, a second AND gate to which a reverse signal of the bad block flag signal and a bit of the remapping block address are input, a NOR gate to which outputs of the first and second AND gates are input, and an inverter to which an output of the NOR gate is input and which outputs the row address signal.

A memory cell in the main cell blocks may be a floating gate type flash memory cell.

At least one of the above and other features and advantages may also be realized by providing a bad block remapping method of a non-volatile memory device including a plurality of main cell blocks selected by a row address signal, a predetermined number of the main cell blocks serve as remapping blocks to replace a bad block in the main cell blocks. The method includes storing a bad block address for addressing the bad block, generating a remapping address matching the bad block address, comparing an external block address, which is for addressing the main cell blocks and is input from an external source, to the bad block address and generating a bad block flag signal, generating a remapping block address for selecting the remapping blocks in response to a remapping address matching the bad block address, selecting one of the external block address and the remapping block address in response to the bad block flag signal to generate a selected address, and outputting a row address signal in accordance with the selected address.

A memory cell in the main cell blocks of the non-volatile memory device may be a floating gate type flash memory cell.

The predetermined number of remapping blocks may include main cell blocks from a main cell block having an uppermost address to a main cell block counted from the main cell block having the upper most address in reverse order up to the predetermined number.

When the bad block flag signal indicates that the external block address does not equal the bad block address, the external block address may be output as the row address signal.

When the bad block flag signal indicates that the external block address equals the bad block address, the remapping block address may be output as the row address signal.

At least one of the above and other features and advantages may also be realized by providing an article of manufacture having a machine accessible medium including data that, when accessed by a machine, cause the machine to perform a method for remapping a non-volatile memory device including a plurality of main cell blocks selected by a row address signal, a predetermined number of the main cell blocks serve as remapping blocks to replace a bad block in the main cell blocks, the method including storing a bad block address for addressing the bad block, generating a remapping address matching the bad block address, comparing an external block address, which is for addressing the main cell blocks and is input from an external source, to the bad block address and generating a bad block flag signal, generating a remapping block address for selecting the remapping blocks in response to a remapping address matching the bad block address, selecting one of the external block address and the remapping block address in response to the bad block flag signal to generate a selected address, and outputting a row address signal in accordance with the selected address.

BRIEF DESCRIPTION OF THE DRAWINGS

The above and other features and advantages will become more apparent to those of ordinary skill in the art by describing in detail exemplary embodiments with reference to the attached drawings, in which:

FIG. 2 illustrates a table for explaining addresses of main cell blocks used as remapping blocks of FIG. 1;

DETAILED DESCRIPTION

Korean Patent Application No. 10-2008-0083027, filed on Aug. 25, 2008, in the Korean Intellectual Property Office, and entitled: "Non-Volatile Memory Device and Bad Block Remapping Method," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Figure 1:
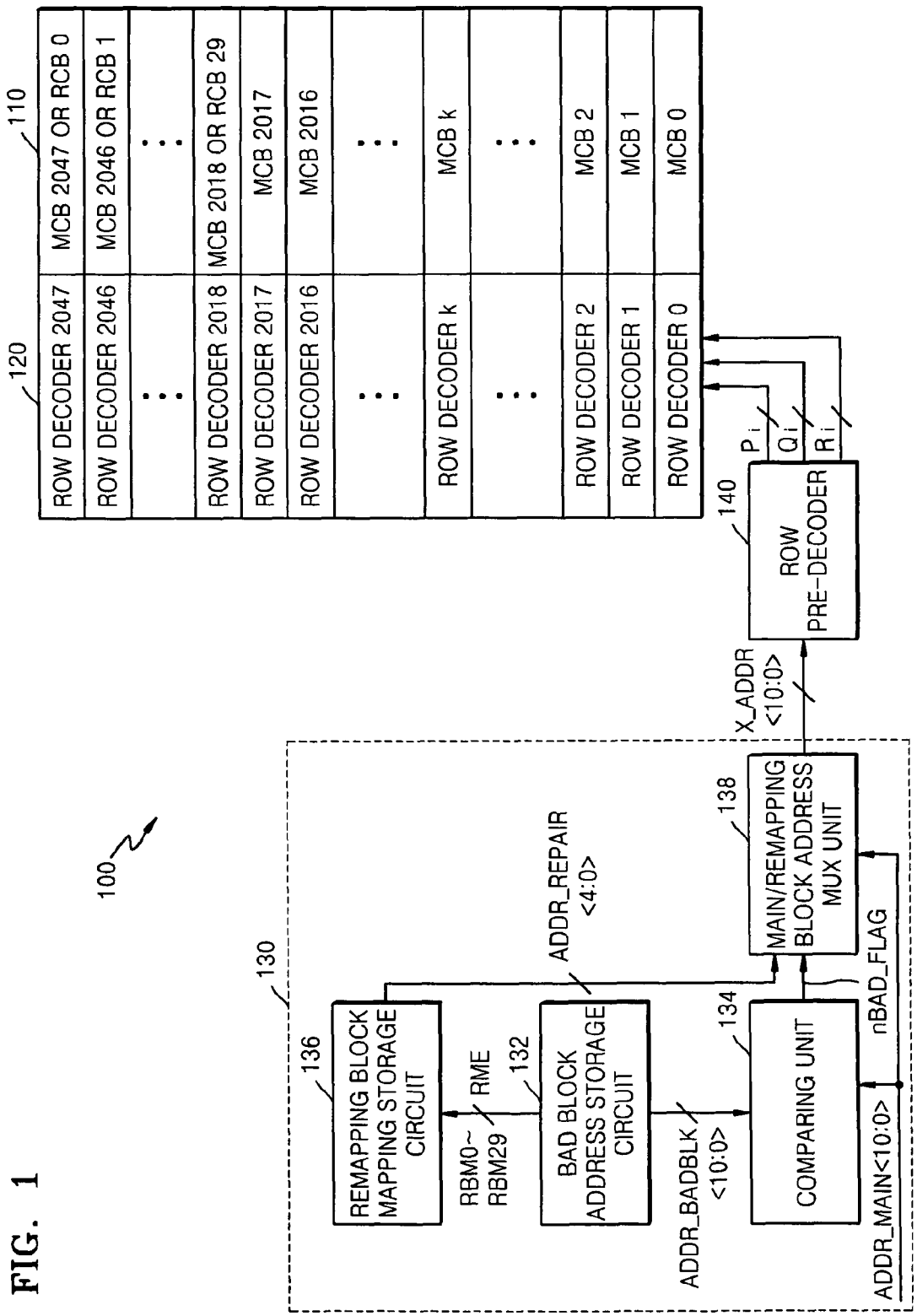
FIG. 1 illustrates a NAND flash memory device according to an embodiment.

FIG. 1 illustrates a NAND flash memory device 100 according to an embodiment. Referring to FIG. 1, the NAND flash memory device 100 may include a memory cell array 110, a row decoder unit 120, a remapping block mapping controlling unit 130, and a row pre-decoder 140.

A memory cell array 110 may include a plurality of memory blocks. Each of the memory blocks may include a plurality of floating gate type flash memory cells arranged in an array. In FIG. 1, the flash memory cell includes 2048 main cell blocks MCB0 through MCB2047. From among the main cell blocks MCB0 through MCB2047, some main cell blocks (e.g., MCB2047 through MCB2018), which run from the main cell block MCB2047 having the uppermost address and a predetermined main cell block counted from the main cell bock MCB 2047 in reverse order by a predetermined number (e.g., 30), may be used as remapping blocks RCB0 through RCB29 for replacing bad blocks in the main cell blocks MCB0 through MCB2047.

The row decoder unit 120 may include row decoders that are respectively connected to the main cell blocks MCB0 through MCB2047. Each row decoder may generate a block selection signal for decoding block address signals Pi, Qi, and Ri, and selecting a corresponding main cell block from among the main cell blocks MCB0 through MCB2047.

The remapping block mapping controlling unit 130 may compare a bad block address ADDR_BADBLK<10:0> to an external block address ADDR_MAIN<10:0> output from an external source, may generate a bad block flag signal nBAD_FLAG, may select one of the external block address ADDR_MAIN<10:0> and a remapping block address ADDR_REPAIR<4:0> in response to the bad block flag signal nBAD_FLAG, and may output a row address signal X_ADDR<10:0>. The row address signal X_ADDR<10:0> may be decoded by the row pre-decoder 140 to generate the block address signals Pi, Qi, and Ri.

The remapping block mapping controlling unit 130 may include a bad block address storage circuit 132, a comparing unit 134, a remapping block mapping storage circuit 136, and a main/remapping block address MUX unit 138.

The bad block address storage circuit 132 may store an address of a bad block from among the main cell blocks MCB0 through MCB2017. The bad block address storage circuit 132 may be a register. The bad block address storage circuit 132 may generate the remapping addresses RBM0 through RBM29 and a remapping enable signal RME, which match the bad block address ADDR_BADBLK<10:0>, in order to replace the bad block with the remapping blocks MCB2047 through MCB2018 or RCB0 through RCB29.

The comparing unit 134 may compare the external block address ADDR_MAIN<10:0> and the bad block address ADDR_BADBLK<10:0> stored in the bad block address storage circuit 132. The comparing unit 134 may generate the bad block flag signal nBAD_FLAG having a logic low level when the external block address ADDR_MAIN<10:0> is identical to the bad block address ADDR_BADBLK<10:0>, and may generate the bad block flag signal nBAD_FLAG having a logic high level when the external block address ADDR_MAIN<10:0> is not identical to the bad block address ADDR_BADBLK<10:0>.

The remapping block mapping storage circuit 136 may provide the remapping block address ADDR_REPAIR<4:0> in response to the remapping addresses RBM0 through RBM29. The remapping block address ADDR_REPAIR<4:0> may select the remapping blocks MCB2047-MCB2018 or RCB0-RCB29 for replacing the bad block. As shown in FIG. 2, with regard to an address of the remapping blocks MCB2047 through MCB2018, from among 11 bit X[10:0] addresses, the top 6 bit X[10:5] addresses are set as "1", and the bottom 5 bit X[4:0] address are from 11111 to 00010.

Figure 3:
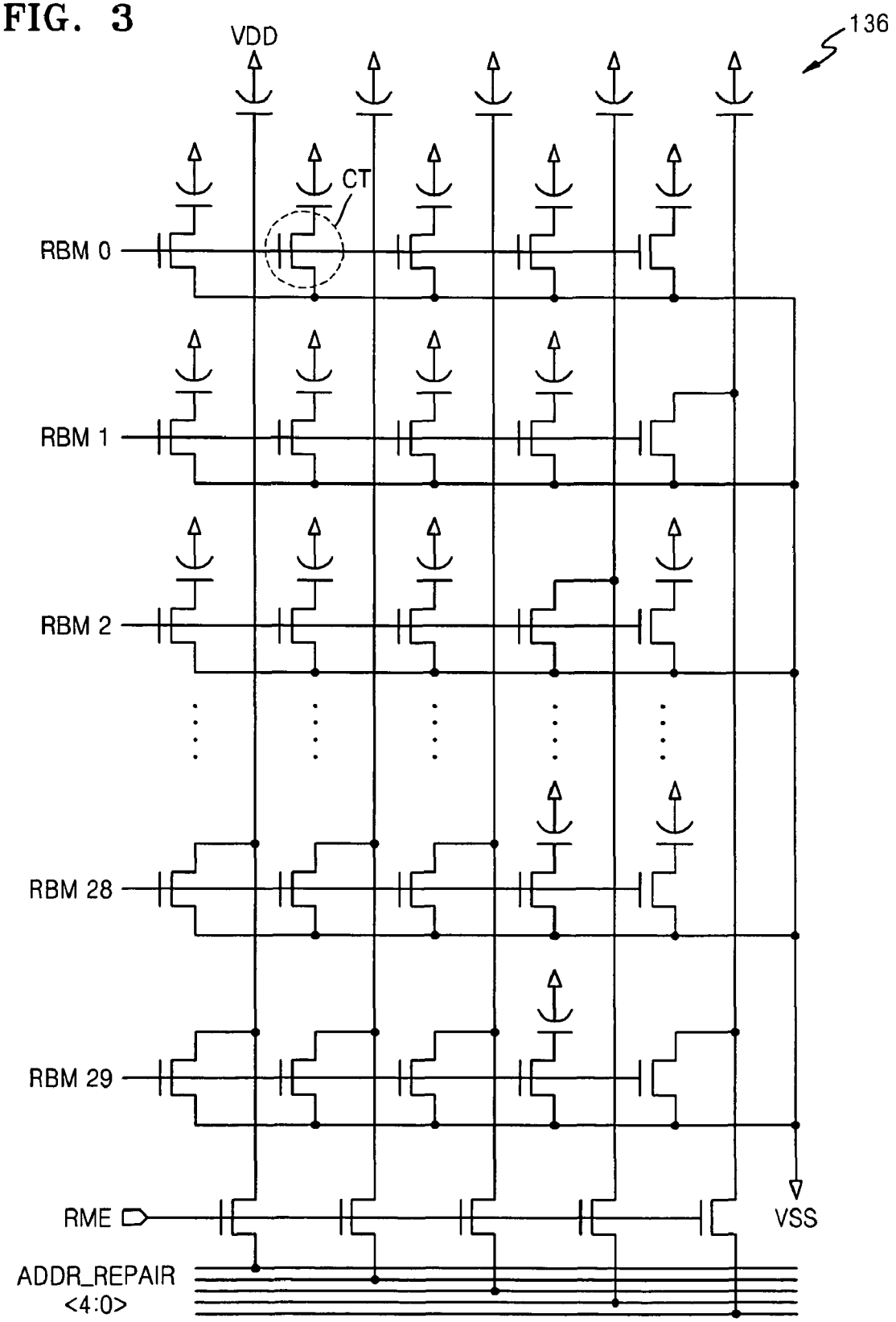
FIG. 3 illustrates a circuit diagram of a remapping block mapping storage circuit of FIG. 1 according to an embodiment.

FIG. 3 illustrates a circuit diagram of the remapping block mapping storage circuit 136 of FIG. 1 according to an embodiment. Referring to FIG. 3, the remapping block mapping storage circuit 136 may include a plurality of cell transistors CT arranged in rows and columns. The cell transistors CT may be connected to a power voltage VDD source and ground voltage VSS source. The cell transistors CT provide the remapping block address ADDR_REPAIR<4:0> corresponding to the remapping addresses RBM0 through RBM29 in response to the remapping addresses RBM0 through RBM29.

When the remapping enable signal RME, for example, the remapping address RBM0 is activated, the remapping block address ADDR_REPAIR<4:0> may be generated as 11111. Thus, the remapping block address ADDR_REPAIR<4:0> set as 11111 is identical to the bottom 5 bit X[4:0] address of the remapping block MCB2047 of FIG. 2. When the remapping address RBM1 is activated, the remapping block address ADDR_REPAIR<4:0> may be generated as 11110. Thus, the remapping block address ADDR_REPAIR<4:0> set as 11110 is identical to the bottom 5 bit X[4:0] address of the remapping block MCB2046 of FIG. 2. This correspondence may be carried forth throughout the remapping addresses, such that when the remapping address RBM29 is activated, the remapping block address ADDR_REPAIR<4:0> may be generated as 00010. The remapping block address ADDR_REPAIR<4:0> set as 00010 is identical to the bottom 5 bit X[4:0] of the remapping block MCB2018 of FIG. 2.

Figure 4:
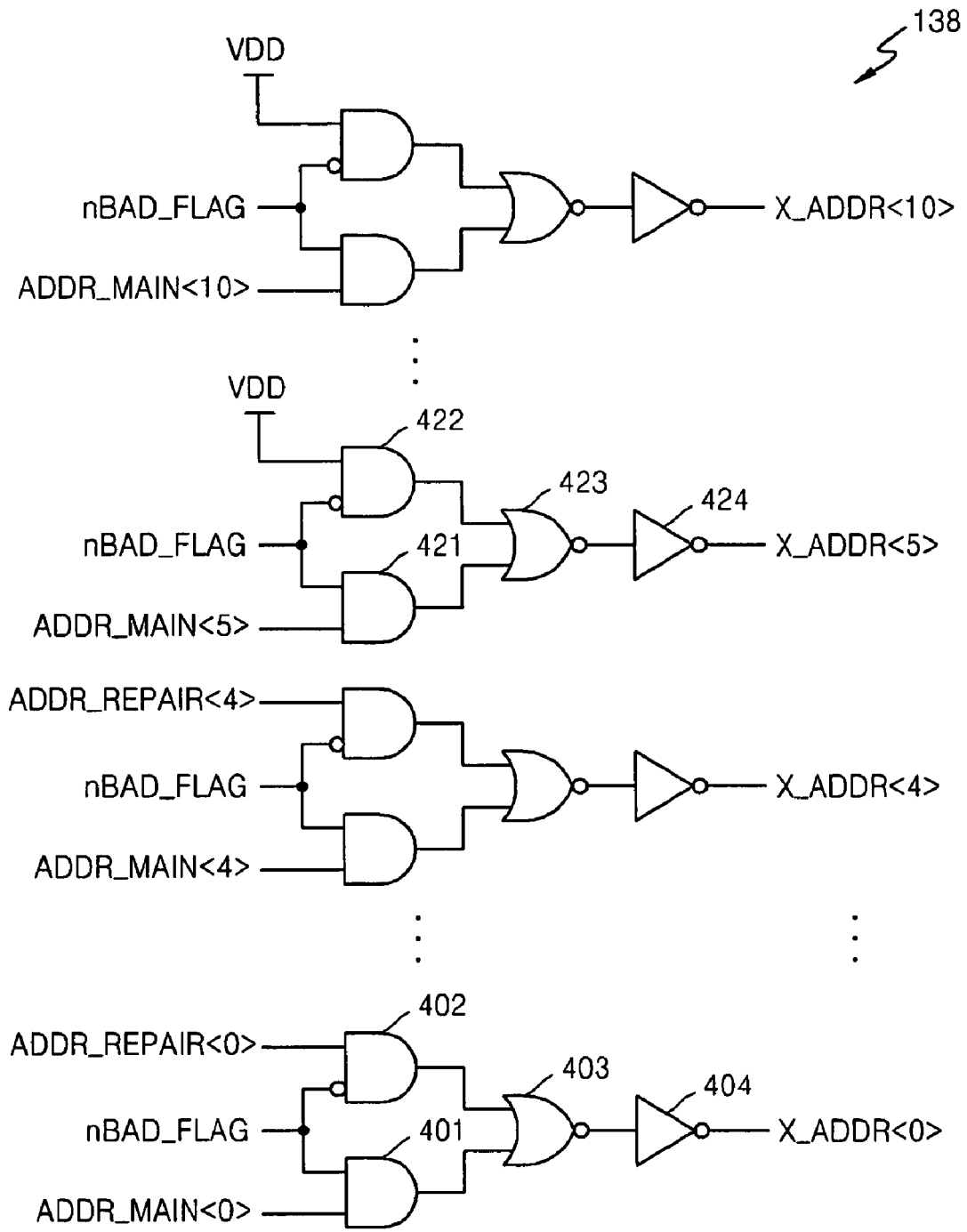
FIG. 4 illustrates a main/remapping block address MUX unit of FIG. 1 according to an embodiment.

FIG. 4 illustrates the main/remapping block address MUX unit 138 of FIG. 1 according to an embodiment. Referring to FIG. 4, the main/remapping block address MUX unit 138 may select one of an external block address ADDR_MAIN<4:0> and the remapping block address ADDR_REPAIR<4:0> in response to the bad block flag signal nBAD_FLAG, may output a row address signal X_ADDR<4:0>, and then may output an external block address ADDR_MAIN<10:5> to a row address signal X_ADDR<10:5>.

The main/remapping block address MUX unit 138 may include a first AND gate 401, to which the bad block flag signal nBAD_FLAG and an external block address bit ADDR_MAIN<0> are input, a second AND gate 402, to which a reverse signal of the bad block flag signal nBAD_FLAG and a remapping block address bit ADDR_REPAIR<0> are input, a first NOR gate 403, to which outputs of the first and second AND gates 401 and 402 are input, and a first inverter 404, to which an output of the first NOR gate 403 is input, and which outputs a row address signal X_ADDR<0>.

When the bad block flag signal nBAD_FLAG has a logic high level, i.e., when the comparing unit 134 determines that the external block address ADDR_MAIN<10:0> is not identical to the bad block address ADDR_BADBLK<10:0>, the external block address ADDR_MAIN<0> may be output as the row address signal X_ADDR<0>. When the bad block flag signal nBAD_FLAG has a logic low level, i.e., when the comparing unit 134 determines that the external block address ADDR_MAIN<10:0> is identical to the bad block address ADDR_BADBLK<10:0>, the remapping block address bit ADDR_REPAIR<0> may be output as the row address signal X_ADDR<0>. Likewise, the main/remapping block address MUX unit 138 selects one of an external block address ADDR_MAIN<4:1> and a remapping block address ADDR_REPAIR<4:1> in response to the bad block flag signal nBAD_FLAG, and then outputs a row address signal X_ADDR<4:1>.

The main/remapping block address MUX unit 138 may include a third AND gate 421, to which the bad block flag signal nBAD_FLAG and an external block address bit ADDR_MAIN<5> are input, a fourth AND gate 422, to which a reverse signal of the bad block flag signal nBAD_FLAG and a logic high level of the power voltage VDD are input, a second NOR gate 423, to which outputs of the third and fourth AND gates 421 and 422 are input, and an inverter 404, to which an output of the second NOR gate 423 is input, and which outputs a low address signal X_ADDR<5>.

When the bad block flag signal nBAD_FLAG has a logic high level, the external block address bit ADDR_MAIN<5> is output to the row address signal X_ADDR<5>. When the bad block flag signal nBAD_FLAG has a logic low level, a logic high level of the power voltage VDD is output to the low address signal X_ADDR<5>. Likewise, the main/remapping block address MUX unit 138 selects one of the external block address ADDR_MAIN<10:5> and the logic high level of the power voltage VDD in response to the bad block flag signal nBAD_FLAG, and then outputs the row address signal X_ADDR<10:5>.

When the bad block flag signal nBAD_FLAG has a logic low level, the bad block needs to be replaced with the remapping blocks MCB2047 through MCB2018. Thus, as illustrated in FIG. 2, since the top 6 bit X[10:5] addresses are set as "1" in the remapping blocks MCB2047 through MCB2018, the row address signal X_ADDR<10:5> is generated as "1".

Referring back to FIG. 1, the row address signal X_ADDR<10:5> is decoded by the row pre-decoder 140 to generate the block address signals Pi, Qi, and Ri. The block address signals Pi, Qi, and Ri provide row decoders that are respectively connected to the main cell blocks MCB0 through MCB2047. Each row decoder may generate a block cell selection signal for decoding the block address signals Pi, Qi, and Ri, and selecting a corresponding main cell block from among the main cell blocks.

Generally, flash memory devices include a memory cell array including a plurality of main cell blocks, and the main cell blocks have their own exclusive block addresses. Each main cell block is connected to a row decoder decoding block address signals, and is selected in response to a block selection signal generated by the row decoder. Main cell blocks, which are between a main cell block having the uppermost address and a predetermined main cell block counted from the main cell block in reverse order by a predetermined number, are used as redundant blocks for replacing bad blocks in the main cell blocks.

However, flash memory devices need to provide redundant block address signals to a row decoder in addition to block address signals provided to the row decoder in order to select redundant blocks. Redundant block signals correspond to address signals of bad blocks. Thus, due to bussing redundant block address signals to row decoders, the chip size of flash memory devices may be increased.

In contrast, in accordance with embodiments, a memory device, e.g., a NAND flash memory device, may select remapping blocks for replacing bad blocks according to block address signals provided to the row decoder. Accordingly, since separate bussing of remapping block address signals is not required to select previous remapping blocks, the chip size of the memory device may be reduced.

Exemplary embodiments have been disclosed herein, and although specific terms are employed, they are used and are to be interpreted in a generic and descriptive sense only and not for purpose of limitation. For example, the bad block remapping of embodiments may be implemented firmware or in software, e.g., by an article of manufacture having a machine-accessible medium including data that, when accessed by a machine, cause the machine to remap bad blocks. Accordingly, it will be understood by those of ordinary skill in the art that various changes in form and details may be made without departing from the spirit and scope of the present invention as set forth in the following claims.

What is claimed is:

1. A non-volatile memory device, comprising:
    a memory cell array including a plurality of main cell blocks, wherein a predetermined number of main cell blocks serve as remapping blocks for replacing a bad block in the main cell blocks;
    a row decoder unit configured to decode a row address signal to generate block address signals addressing the main cell blocks; and
    a remapping block mapping controlling unit configured to:
        compare an external block address input by an external source and a stored bad block address,
        generate a bad block flag signal,
        generate a remapping block address for selecting the remapping blocks by matching a remapping address with the stored bad block address,
        select one of the external block address and the remapping block address in response to the bad block flag signal to create a selected address, and
        output the row address signal in accordance with the selected address.

2. The non-volatile memory device as claimed in claim 1, wherein the predetermined number of remapping blocks includes main cell blocks from a main cell block having an uppermost address to a main cell block counted from the main cell block having the upper most address in reverse order up to the predetermined number.

3. The non-volatile memory device as claimed in claim 1, wherein the row decoder unit comprises:
    a row pre-decoder configured to decode the row address to generate the block address signals; and
    a row decoder connected to each of the main cell blocks, the row decoder configured to select a corresponding main cell block from among the main cell blocks in response to the block address signals.

4. The non-volatile memory device as claimed in claim 1, wherein the remapping block mapping controlling unit comprises:
    a bad block address storage circuit configured to store the bad block address and generate the remapping address;
    a comparing unit configured to compare the external block address to the bad block address and generating the bad block flag signal;
    a remapping block mapping storage circuit configured to generate the remapping block address corresponding to the remapping address in response to the remapping address; and
    a main/remapping block address MUX unit configured to select the selected address in response to the bad block flag and to output the row address signal in accordance with the selected address.

5. The non-volatile memory device as claimed in claim 4, wherein the bad block address storage circuit comprises a register.

6. The non-volatile memory device as claimed in claim 4, wherein the remapping block mapping storage circuit comprises a plurality of cell transistors arranged in rows and columns,
    wherein the cell transistors are electrically connected to a power voltage source or a ground voltage source, and the remapping address is supplied to gates of the cell transistors.

7. The non-volatile memory device as claimed in claim 4, wherein the main/remapping block address MUX unit comprises:
    a first AND gate to which the bad block flag signal and the external block address are input;
    a second AND gate to which a reverse signal of the bad block flag signal and a bit of the remapping block address are input;
    a NOR gate to which outputs of the first and second AND gates are input; and
    an inverter to which an output of the NOR gate is input and which outputs the row address signal.

8. The non-volatile memory device as claimed in claim 1, wherein a memory cell in the main cell blocks is a floating gate type flash memory cell.

9. A bad block remapping method of a non-volatile memory device including a plurality of main cell blocks selected by a row address signal, a predetermined number of the main cell blocks serve as remapping blocks to replace a bad block in the main cell blocks, the method comprising:
    storing a bad block address for addressing the bad block;
    generating a remapping address matching the bad block address;
    comparing an external block address, which is for addressing the main cell blocks and is input from an external source, to the bad block address and generating a bad block flag signal;
    generating a remapping block address for selecting the remapping blocks in response to a remapping address matching the bad block address;
    selecting one of the external block address and the remapping block address in response to the bad block flag signal to generate a selected address; and
    outputting a row address signal in accordance with the selected address.

10. The method as claimed in claim 9, wherein a memory cell in the main cell blocks of the non-volatile memory device is a floating gate type flash memory cell.

11. The method as claimed in claim 9, wherein the predetermined number of remapping blocks includes main cell blocks from a main cell block having an uppermost address to a main cell block counted from the main cell block having the upper most address in reverse order up to the predetermined number.

12. The method as claimed in claim 9, wherein, when the bad block flag signal indicates that the external block address does not equal the bad block address, outputting the external block address as the row address signal.

13. The method as claimed in claim 9, wherein, when the bad block flag signal indicates that the external block address equals the bad block address, outputting the remapping block address as the row address signal.

14. An article of manufacture having a machine accessible medium including data that, when accessed by a machine, cause the machine to perform a method for remapping a non-volatile memory device including a plurality of main cell blocks selected by a row address signal, a predetermined number of the main cell blocks serve as remapping blocks to replace a bad block in the main cell blocks, the method comprising:

storing a bad block address for addressing the bad block;

generating a remapping address matching the bad block address;

comparing an external block address, which is for addressing the main cell blocks and is input from an external source, to the bad block address and generating a bad block flag signal;

generating a remapping block address for selecting the remapping blocks in response to a remapping address matching the bad block address;

selecting one of the external block address and the remapping block address in response to the bad block flag signal to generate a selected address; and outputting a row address signal in accordance with the selected address.

* * * * *